(12) United States Patent
Chang

(10) Patent No.: US 6,745,275 B2
(45) Date of Patent: Jun. 1, 2004

(54) FEEDBACK SYSTEM FOR ACCOMODATING DIFFERENT MEMORY MODULE LOADING

(75) Inventor: Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 494 days.

(21) Appl. No.: 09/756,073

(22) Filed: Jan. 8, 2001

(65) Prior Publication Data

US 2002/0004893 A1 Jan. 10, 2002

Related U.S. Application Data

(60) Provisional application No. 60/177,906, filed on Jan. 25, 2000.

(30) Foreign Application Priority Data

Jul. 5, 2000 (TW) ........................................ 89113312 A

(51) Int. Cl.$^7$ .............................................. G06F 13/14
(52) U.S. Cl. .......................... 710/305; 710/74; 710/301; 711/154
(58) Field of Search ............................ 710/33, 73, 305, 710/302; 711/154

(56) References Cited

U.S. PATENT DOCUMENTS

| | | | | |
|---|---|---|---|---|
| 5,353,431 A | * | 10/1994 | Doyle et al. ................. | 711/206 |
| 5,886,576 A | * | 3/1999 | Carlson ....................... | 330/251 |
| 6,034,878 A | * | 3/2000 | Osaka et al. .................. | 365/52 |
| 6,215,686 B1 | * | 4/2001 | Deneroff et al. .............. | 365/52 |
| 6,304,814 B1 | * | 10/2001 | Masters et al. ............. | 701/110 |
| 6,336,176 B1 | * | 1/2002 | Leyda et al. ................. | 711/170 |
| 6,353,885 B1 | * | 3/2002 | Herzi et al. .................... | 713/1 |
| 6,470,483 B1 | * | 10/2002 | Rodriguez et al. ............. | 716/6 |

* cited by examiner

*Primary Examiner*—Mark H. Rinehart
*Assistant Examiner*—Thomas J. Cleary
(74) *Attorney, Agent, or Firm*—J. C. Patents

(57) ABSTRACT

A feedback system capable of accommodating different memory module loading. The feedback system utilizes the signal received by the data strobe feedback pin of a control chipset to simulate or to obtain memory module loading information so that timing of the data signal and data strobe signal can be adjusted accordingly. Therefore, data can be accurately written to or read from the memory module. The embodiment of this invention includes using a variable reference voltage source and a comparator to adjust the timing of the signal to the data strobe feedback pin, using independent simulating loads circuit and specially designed memory module with simulating load, and using a data strobe signal circuit that includes complete memory module loading.

4 Claims, 4 Drawing Sheets

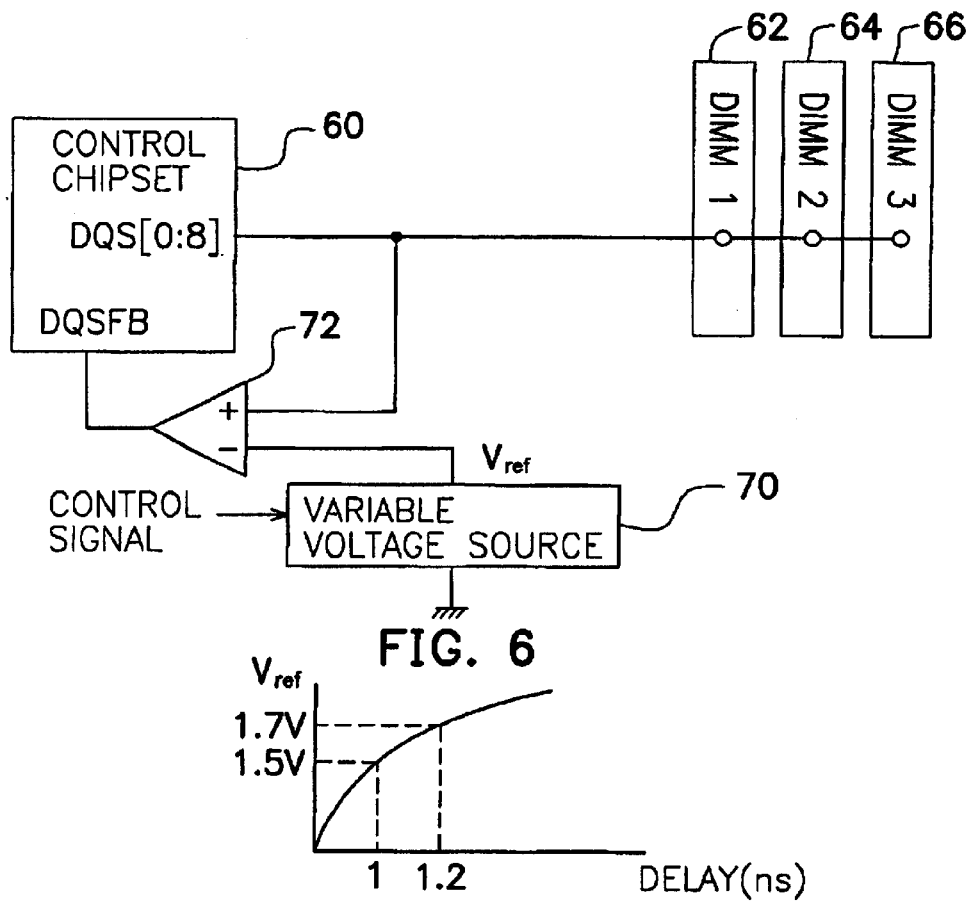
FIG. 6
FIG. 7
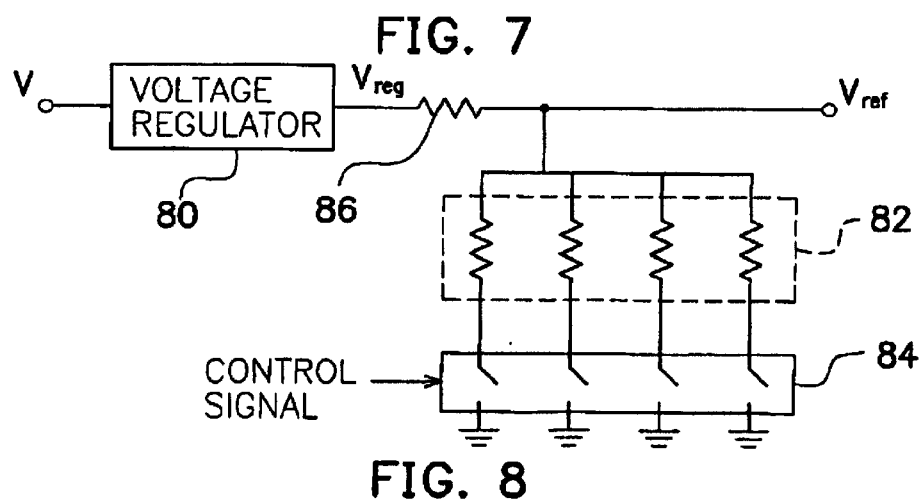
FIG. 8

FEEDBACK SYSTEM FOR ACCOMODATING DIFFERENT MEMORY MODULE LOADING

CROSS-REFERENCE TO RELATED APPLICATION

This application claims the priority benefit of Taiwan application serial no. 89113312, filed Jul. 5, 2000, and U.S. provisional application serial No. 60/177,906, filed Jan. 25, 2000.

BACKGROUND OF THE INVENTION

1. Field of Invention

The present invention relates to the memory control circuit of a computer system. More particularly, the present invention relates to a feedback system on a computer motherboard capable of accommodating different memory module loading through delay adjustment.

2. Description of Related Art

Through rapid advance in semiconductor fabrication technologies, raw processing power of the central processing unit (CPU) inside a computer has increased considerably. Because of such rapid progress, clocking frequency of most personal computer (PC) has also increased from a few MHz in the past to more than one GHz now. To operate a high-power computer system, considerably amount of memory must also be used. Nowadays, most personal computer may contain several megabytes to a few gigabytes of memory. Following the increase in the clocking rate of CPU, most memory unit operates at a clocking frequency of 100 Mz or above.

A conventional low-speed memory control circuit transmits data by matching data signals with clocking signals. However, as the operating frequency of a computer system increases, such a simple arrangement is impossible to transmit data with sufficient accuracy. To increase data transmission capacity and improve high-speed transmission accuracy of memory signal, a data strobe (DS) method is introduced to reduce data loss due to high-speed transmission.

In some actual applications, data signal DAT and data strobe signal DS are transmitted synchronously from the same transmitting end. At the receiving end, the data strobe signal DS is delayed by a short interval. The short delay allows an integrated circuit to setup and hold a particular data signal such that the data can be accurately read. In other words, the transmitting end sends out a data signal DAT and a data strobe signal DS at the same edge of a clocking signal. Utilizing the almost identical delay trace of an integrated circuit, transmission route and integrated circuit buffer delays are balanced so that any skew between the data signal DAT and the data strobe signal DS is minimized.

In practice, the delay depends on a number of factors including the skew between the data signal DAT and the data strobe signal DS, the design of delay elements, the operating frequency of system and a few other environmental factors. Due to such complications, another method is suggested to tackle the delay setup problem. The method is to delay the data strobe signal DS by a quarter cycle of the clocking signal CLK. No matter what the clocking frequency of a particular system is, the data strobe signal DS always starts in the mid-portion of the positive half cycle or the negative half cycle of the a clock cycle CLK. By this means, accuracy of the data is ensured.

To ensure the triggering of the data strobe signal DS at a proper time, for example, at one quarter cycle delay of the clock signal CLK, and match the data signal DAT, most data strobe signal DS line includes a feedback route that connects from a half-way point to the memory unit to a data strobe feedback (DSF) pin. By tapping the return signal at the data strobe feedback (DSF) pin, status of signal transmission can be monitored and the moment to emit data strobe signal for obtaining correct data can be determined. In general, a phase lock circuit is employed to perform the timing adjustment.

FIG. 1 is a sketch of a conventional feedback control circuit of a memory module. As shown in FIG. 1, the control chipset 10 has a plurality of data strobe pins DQS[0:8] and a data strobe feedback pin DQSFB. The data strobe pins DQS[0:8] are connected to the data strobe pins (not shown) of a plurality of memory module slots 12, 14 and 16. A trace line is selected such that a branch back line is tapped at a halfway point back to the data strobe feedback pin DQSFB. The branching point is set to make the path length from the point to the memory module slots 12, 14, 16 (Path 1) and the path length from the point to the data strobe feedback pin (Path 2) almost identical. Hence, almost identical transmission delay is simulated. With this arrangement, signal submitted to the data strobe feedback pin DQSFB of the control chipset reflects actual data strobe delay at the memory module terminal.

However, actual delay is also dependent upon the loading at the memory module slots. In other words, the data transmission delay varies according to the number of memory modules plugged into the memory module slots and the number of integrated circuits inside the memory module. The aforementioned feedback system has no special mechanism for adjusting the timing between data signal DAT and data strobe signal DS according to the actual memory module loading. Therefore, the stability of a computer system may be affected.

In addition, signal waveform arriving at the memory slot terminal is slightly distorted due to the presence of a branch along the trace line. Such distortion is likely to affect timing tolerance when data are read. Moreover, the conventional feedback system demands setting of the branching point to a position where the path length from the point to the memory module slot and the path from the point to the data strobe feedback pin are identical. Hence, wiring layout is further constrained and additional printed circuit board area may be required.

SUMMARY OF THE INVENTION

Accordingly, one object of the present invention is to provide a feedback system capable of accommodating different memory module loading. In other words, the feedback system can self-adjust to accommodate any number of memory modules plugged into the memory slots and any difference in the number of integrated circuits inside the memory module. Consequently, the control chipset is able to adjust the timing between the data signal DAT and the data strobe signal DS according to the actual memory loading so that data transmission accuracy is greatly improved.

A second object of the invention is to provide a feedback system capable of accommodating different memory module loading without having to set a branching point in such a way that the path from the point to a memory module slot and the path from the point to a data strobe feedback pin are almost identical. Hence, layout design is simplified and demands for printed circuit board area is reduced.

To achieve these and other advantages and in accordance with the purpose of the invention, as embodied and broadly described herein, the invention provides a feedback system in a computer system for accommodating different memory module loading. The feedback system includes a plurality of memory module slots, a control chipset, a variable reference voltage and a comparator. The memory module slots can accommodate at least one memory module. The control chipset has a plurality of data strobe pins and a data strobe feedback pin. The data strobe pins are connected to the data strobe pin on the memory module slots. The variable reference voltage provides a reference voltage. The comparator has a first input terminal, a second input terminal and an output terminal. The output terminal of the comparator is connected to the data strobe feedback signal pin. The first input terminal of the comparator receives a reference voltage. The second input terminal of the comparator is connected to any point along the line from the data strobe pins of the control chipset to the data strobe pins at the memory module slots. The variable reference voltage is set by the computer system so that output timing of the comparator can be adjusted. Through the adjustment of the reference voltage, a suitable data strobe feedback signal is sent to the control chipset for adjusting data signal DAT and data strobe signal DS timing and obtaining accurate data from the memory module.

According to one embodiment of this invention, the variable reference voltage of the feedback system is under the control of a control signal. The control signal is issued from the control chipset. When a computer system is started, the computer system will automatically read out the state of assembly of the memory modules plugged onto the memory module slots. The variable reference voltage is set according to the state of assembly. However, a user may set up some other configuration through the basic input/output system of the computer.

The invention provides a second feedback system in a computer system capable of accommodating different memory module loading. The computer system uses memory modules. Each memory module has loading pins and simulating loads. The simulating loads are connected to the loading pins. The feedback system of this invention includes a plurality of memory module slots and a control chipset. Each memory module slot can accommodate a memory module and has a loading pin. When a memory module is plugged into the memory module slot, the loading pin on the memory module is connected to the loading pin of the memory module slot. The control chipset is coupled to the memory module slots. The control chipset has data strobe pin and data strobe feedback signal pin. The data strobe pins of the control chipset are first connected to the loading pins of any one of the memory module slots and then serially connected to the other memory module slots. The last memory slot is connected to the data strobe feedback signal pin to form a 'branchless' signal feedback loop. When a memory module is plugged into the memory slot, the control chipset utilizes the signal received from the data strobe feedback pin to simulate the delay caused by the load on the memory slot. Hence, data can be accurately written to or read from the memory module.

The invention provides a third feedback system capable of accommodating different memory module loading. The feedback system includes a plurality of memory module slots and a control chipset. The memory module slots can accommodate at least one memory module. Each memory slot has data strobe pins. The control chipset is coupled to the memory slots. The control chipset has data strobe pins and a data strobe feedback pin. The data strobe pin of the control chipset is first connected to the data strobe pin of any one of the memory slots and then serially connected to the data strobe pin of the other memory slots. The last memory slot is connected to the data strobe feedback pin of the control chipset to form a 'branchless' signal feedback loop. When a memory module is plugged into the memory slot, the control chipset utilizes the signal received from the data strobe feedback pin to obtain loading information on the memory slot. Hence, the delay can be computed and data can be accurately written to or read from the memory module.

The invention provides a fourth feedback system capable of accommodating different memory module loading. The feedback system includes a plurality of memory module slots, a plurality of simulating loads, a group of switches and a control chipset. The memory slots can accommodate at least one memory module. The simulating loads are used to simulate the delay caused by memory module loading. The switches are coupled to the simulating loads for activating a portion of the simulating loads. The control chipset is coupled to the memory slots. The control chipset has data strobe pins and a data strobe feedback pin. The data strobe pins of the control chipset are first connected to the simulating loads and then connected back to the data strobe feedback pin. When a memory module is plugged into the memory slot, the switches activate a portion of the simulating loads. The control chipset utilizes the signals received from the data strobe feedback pin to simulate possible delay caused by the loading condition at the memory slot. Hence, data can be accurately written to or read from the memory module.

According to another embodiment of this invention, the group of switches for activating the simulating load is triggered by a switch control signal. The switch control signal is issued by the control chipset. After the computer system is switched on, the computer system will automatically read out information about the state of assembly of memory modules in the memory slots. According to the configuration information, the group of switches is set to activate a portion of the simulating load simulating the actual loading condition of the memory modules. Alternatively, a user may set the grouping state of the memory module and hence the switches by programming through the basic input/output system.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 6 is a diagram showing a memory module feedback control circuit according to a fourth embodiment of this invention;

FIG. 7 is a graph showing the relationship between the reference voltage and the timing delay according to the control circuit shown in FIG. 6; and FIG. 8 is a block diagram showing an actual example of the variable voltage provider for the control circuit shown in FIG. 6.

DESCRIPTION OF THE PREFERRED EMBODIMENTS

Figure 1:
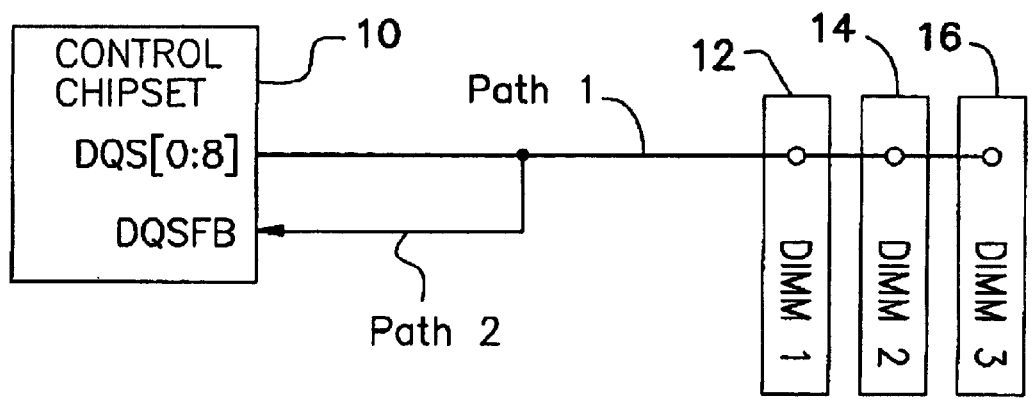
FIG. 1 is a sketch of a conventional feedback control circuit of a memory module.

Reference will now be made in detail to the present preferred embodiments of the invention, examples of which are illustrated in the accompanying drawings. Wherever possible, the same reference numbers are used in the drawings and the description to refer to the same or like parts.

Figure 2:
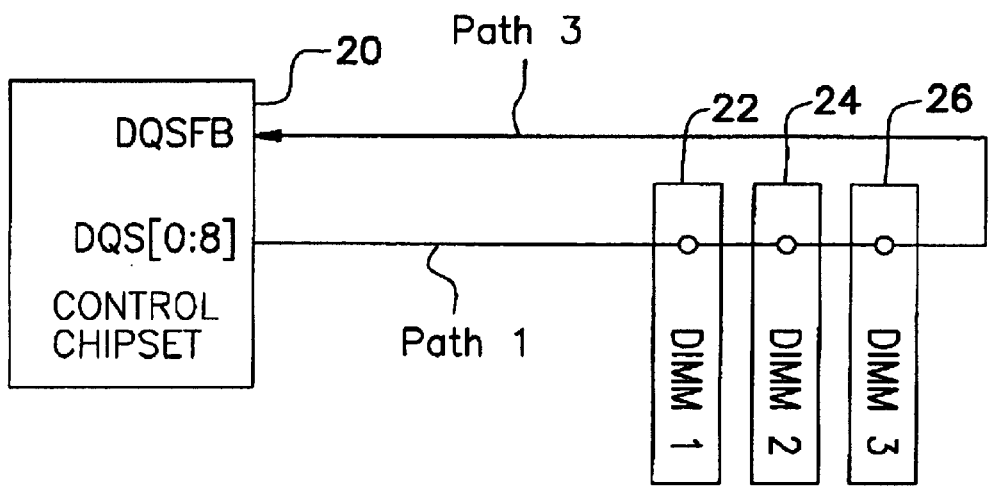
FIG. 2 is a diagram showing a memory module feedback control circuit according to a first embodiment of this invention.

FIG. 2 is a diagram showing a memory module feedback control circuit according to a first embodiment of this invention. As shown in FIG. 2, the feedback control circuit includes a plurality of memory module slots 22, 24, 26 and a control chipset 20. Each memory slot has a data strobe pin. The control chipset 20 has a data strobe pin and a data strobe feedback pin.

Since each memory slots 22, 24, 26 can accommodate one memory module, the original computer system (motherboard) designer has no foresight regarding the number of memory modules in use and hence the actual memory module loading. Consequently, the data strobe pin of the control chipset 20 is first connected to the data strobe pin of any one of the memory slots and then sequentially connected to the other memory slots. The data strobe pin of the last serially connected memory slot is connected to a data strobe feedback pin on the control chipset 20 to form a 'branchless' signal feedback loop. In general, the motherboard of a computer system will include many data strobe pins. However, to simplify the description, only a data strobe line is shown in the feedback loop.

To facilitate wiring layout in the first embodiment, the branchless signal feedback loop starts from the data strobe pin of the control chipset 20 and connects with the data strobe pin of the memory slot 22, which is closest to the control chipset 20. The other memory slots 24 and 26 are connected in sequence according to their relative closeness from the first memory slot 22. Finally, the last connected memory slot 26, which is furthest from the control chipset 20, is connected to the data strobe feedback pin of the control chipset.

In the feedback circuit, the memory module loading is in the feedback loop. When memory modules are plugged into the memory slots such as 22, 24, and 26, the control chipset 20 can make use of signals received from the data strobe feedback pin to obtain loading information for setting signaling delay. Hence, data can be accurately written to or read from the memory module.

Figure 3:
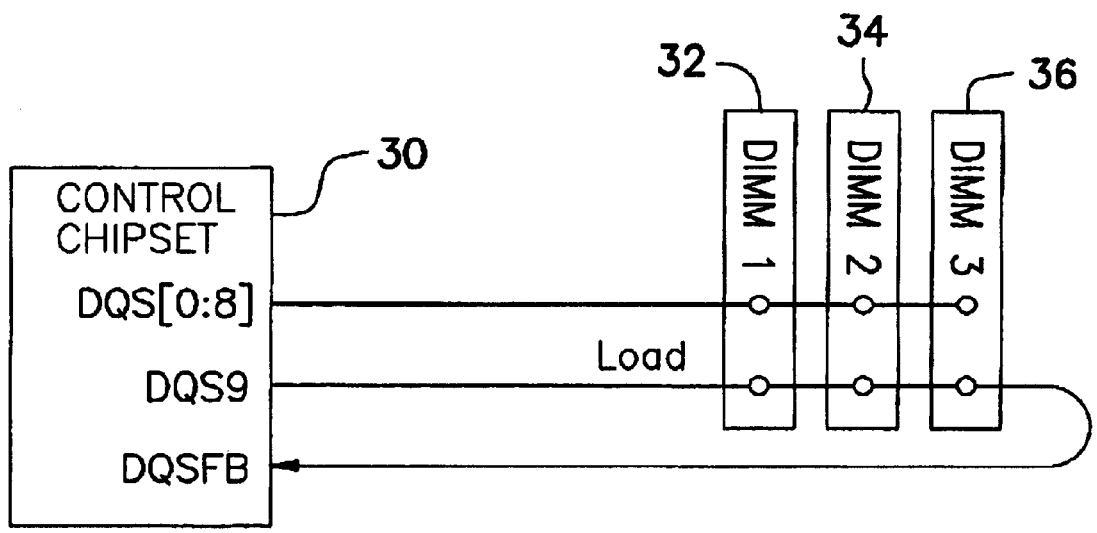
FIG. 3 is a diagram showing a memory module feedback control circuit according to a second embodiment of this invention.
Figure 4:
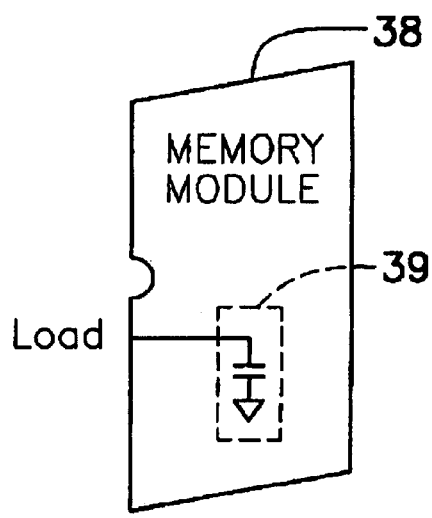
FIG. 4 is a diagram showing one of the memory modules shown in FIG. 3.

FIG. 3 is a diagram showing a memory module feedback control circuit according to a second embodiment of this invention. FIG. 4 is a diagram showing one of the memory modules shown in FIG. 3. As shown in FIGS. 3 and 4, the feedback control circuit can be applied to a computer system. The computer system uses a memory module 38 shown in FIG. 4. The memory module 38 has a loading pin and a simulating load 39 such as a capacitor. The simulating load 39 is connected to the loading pin. The feedback system in this embodiment includes a plurality of memory module slots 32, 34 and 36 and a control chipset 30. Each memory slot has a loading pin. The control chipset 30 has an independent data strobe pin and a data strobe feedback pin in addition to the original data strobe pins.

In the invention, when a memory module is plugged into any one of the memory slots 32, 34, 36, the loading pin of the memory module is connected to the loading pin of the memory slot. The data strobe pin of the control chipset 30 is first connected to the loading pin of any one of the memory slots 32, 34, 36 and then connected to the loading pin of the other memory slots. Finally, the loading pin of the last memory slot is connected to the data strobe feedback pin of the control chipset 30 to form a 'branchless' signal feedback loop.

To facilitate wiring design and shorten path length, the branchless signal feedback loop starts from a data strobe pin of the control chipset 30 and joins with the loading pin of memory slot 32, which is closest to the control chipset 30. The other memory slots 34 and 36 are connected in sequence according to their relative closeness from the first memory slot 32. Finally, the last connected memory slot 36, which is furthest from the control chipset 30, is connected to the data strobe feedback pin of the control chipset 30.

In the second embodiment, the simulating load feedback loop and the actual memory module loading circuit are separate. Hence, interference of the data strobe circuit by the feedback loop is prevented. Furthermore, the simulating loads are in the feedback loop. Therefore, the memory control chipset 30 can utilize the signal picked up by the data strobe pin to simulate the loading at the memory slots when memory modules are plugged into the memory slots 32, 34, 36. Hence, data can be accurately written to or read from the memory modules.

Figure 5:
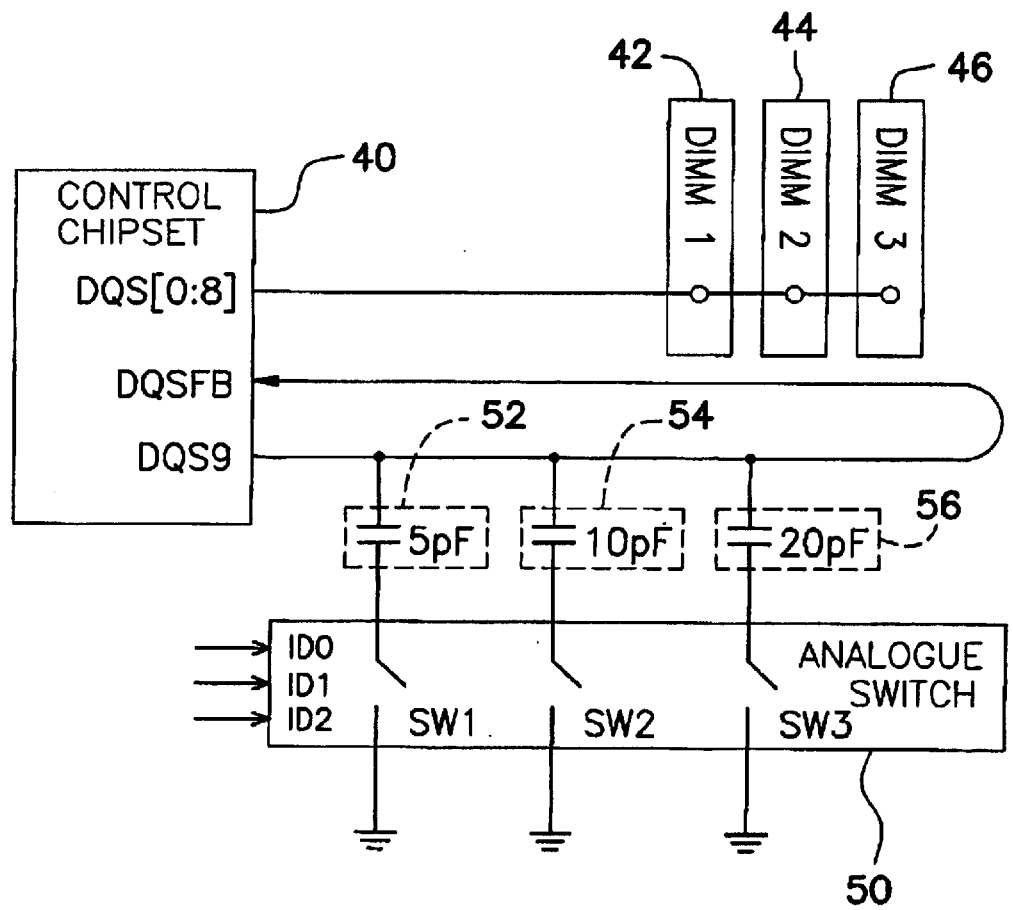
FIG. 5 is a diagram showing a memory module feedback control circuit according to a third embodiment of this invention.

FIG. 5 is a diagram showing a memory module feedback control circuit according to a third embodiment of this invention. As shown in FIG. 5, the feedback control circuit includes a plurality of memory module slots 42, 44, 46, a plurality of simulating loads 52, 54, 56, a group of switches 50 and a control chipset 40. Aside from the original data strobe pins, the control chipset 40 also has an independent data strobe pin and a data strobe feedback pin.

The data strobe pin of the control chipset 40 connects in series with the simulating loads 52, 54, 56 and then returns to the data strobe feedback pin. The simulating loads 52, 54, 56 that connect with the group of switches can be a group of capacitors having different capacitance values. The simulating loads 52, 54, 56 emulate loading delay caused by the memory modules. The group of switches 50 serves to activate (switch) a portion of the simulating loads. The control chipset 40 is connected to the memory module slots 42, 44 and 46. When memory modules are plugged into the memory slots 42, 44, 46, a portion of the simulating loads 52, 54, 56 is activated by the group of switches 50. Utilizing the signal picked up by the data strobe feedback pin, the control chipset 40 can emulate loading on the memory slots 42, 44, 46 to set up proper delay. Hence, data can be accurately written to or read from the memory modules.

According to the third embodiment, the group of switches 50 is triggered by a control switch signal to activate a portion of the simulating loads 52, 54 and 56. The control switch signal is issued by the control chipset 40. After the computer system is turned on, the central processing unit (not shown) of the computer system will automatically read out the status of configuration the memory modules in the memory slots 42, 44, 46 via the control chipset 40. According to the status of configuration, the switches 50 are set to activate a portion of the simulating loads to emulate the loading condition at the memory slots. Alternatively, a computer system user may set up an status of configuration through the basic input/output system (BIOS) to control the switches 50. The group of switches 50 comprises of a plurality of jumpers. The jumpers can be set by user when the memory modules are plugged into the memory slots. In this case, a control signal needs not be supply by the control chipset 40.

FIG. 6 is a diagram showing a memory module feedback control circuit according to a fourth embodiment of this invention. As shown in FIG. 6, the feedback control circuit can accommodate different memory module loading in a computer system. The feedback control circuit includes a plurality of memory module slots 62, 64, 66, a control chipset 60, a variable reference voltage source 70 and a comparator 72. The control chipset 60 has a data strobe pin and a data strobe feedback pin. Each memory slot has a data strobe pin.

The data strobe pin of the control chipset 60 is connected the data strobe pin of the memory slots 62, 64 and 66. One of the input terminal of the comparator 72 is connected to a point somewhere along the line joining the data strobe pin of the chipset 60 and the data strobe pin of the memory slots 62, 64 and 66. The other input terminal of the comparator 72 is connected to the variable reference voltage source 70. The output terminal of the comparator 72 is connected to the data strobe feedback pin of the control chipset 60. To simplify the description, only one data strobe signal line is shown in the feedback circuit.

FIG. 7 is a graph showing the relationship between the reference voltage and the timing delay according to the control circuit shown in FIG. 6. The variable reference voltage source 70 provides a reference voltage to the feedback circuit. When memory modules are plugged into the memory slots 62, 64, 66, the computer system controls the variable reference voltage source 70 to output a voltage and adjust the output timing of the comparator 72. The control chipset 60 utilizes the signal provided by the comparator 72 at the data strobe feedback pin to modify the timing of the data signal DAT and data strobe signal DS. Therefore, data can be accurately written to or read from the memory modules.

According to the fourth embodiment, the variable reference voltage source 70 is controlled by a control signal. The control signal is issued by the control chipset 60. After the computer system is turned on, the central processing unit (not shown) of the computer system will automatically read out the status of configuration of memory modules in the memory slots 62, 64, 66. The variable reference voltage source 70 is set according to the status of configuration of the memory modules. The setting of a reference voltage in turn controls the timing of the data signal DAT and the data strobe signal DS. A computer system user can set the status of configuration and hence control the voltage at the variable reference voltage source 70 by programming the basic input/output system (BIOS). Obviously, the status of configuration must correspond to the memory module loading on the memory slots 62, 64 and 66.

FIG. 8 is a block diagram showing an actual example of the variable voltage provider for the control circuit shown in FIG. 6. As shown in FIG. 8, the variable reference voltage source 70 includes a voltage regulator 80, a resistor 86, a plurality of parallel-connected resistors 82 and a group of switches 84. The voltage regulator 80 provides a precise voltage. One end of the resistor 86 is connected to the voltage regulator 80 while the other end, which is also the reference voltage output terminal, is connected to the parallel-connected resistors 82. The other terminal of the parallel-connected resistors 82 is connected to the group of switches 84. The switches 84 are connected to ground. When the system operates, a control signal is sent to the switches 84 changing the equivalent resistance of the parallel-connected resistors 82 base on voltage divider rule. Hence, voltage at the voltage reference output terminal is changed. The group of switches 84 can also be replaced by a plurality of jumpers. User can directly set the jumpers when the memory modules are plugged into the memory slot. In this case, there is no need for the control chipset to provide a control signal.

Both the variable reference voltage source 70 and the comparator 72 may be incorporated inside the control chipset 60. In addition, the aforementioned branching points may be inside the control chipset or very close to the data strobe pin of the control chipset.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A feedback system inside a computer capable of accommodating different memory module loading, a memory module having a loading pin and a simulating load with the simulating load connected to the loading pin, comprising:

a plurality of memory module slots for plug-in of memory modules, wherein each memory module slot has a loading pin, and when a memory module is plugged into any one of the memory module slots, the loading pin of the memory module is also connected to the loading pin of the memory module slot; and a control chipset connected to the memory module slots, wherein the control chipset has a data strobe pin and a data strobe feedback pin, wherein the data strobe pin of the control chipset is first connected to the loading pin of any one of the memory module slots and then connected to the loading pins of the other memory module slots serially, the loading pin of the last memory module slot is connected to the data strobe feedback pin of the control chipset to form a signal feedback loop, and when memory modules are plugged into some or all of the memory module slots, the control chipset is able to utilize signals received from the data strobe feedback pin to emulate the delay caused by memory module loading at the memory slot and hence data can be accurately written to or read from the memory module, and wherein the data strobe pin of the control chipset is also used to transmit the data, and hence both data transmission and time adjustment are carried out via the signal feedback loop.

2. The feedback system of claim 1, wherein the signal feedback loop is a circuit that starts out from the data strobe pin of the control chipset, connects first with the loading pin of the memory module slot closest to the control chipset, the other memory module slots are similarly connected serially from near to far with the memory module slot furthest from the control chipset connected the last, and the loading pin of the last memory module slot is connected to the data strobe feedback pin of the control chipset.

3. A feedback system capable of accommodating different memory module loading, comprising:
   a plurality of memory module slots for plug-in of at least one memory module, wherein each memory module slot has a data strobe pin; and
   a control chipset connected to the memory module slots, wherein the control chipset has a data strobe pin and a data strobe feedback pin,
   wherein the data strobe pin of the control chipset is first connected to the data strobe pin of any one of the memory module slots and then connected to the data strobe pins of the other memory module slots serially, the data strobe pin of the last memory module slot is connected to the data strobe feedback pin of the control chipset to form a signal feedback loop, and when memory modules are plugged into some or all of the memory module slots, the control chipset is able to utilize signals received from the data strobe feedback pin to emulate the delay caused by memory module plugged into the memory slot and hence data can be accurately written to or read from the memory module, and
   wherein the data strobe pin of the control chipset is also used to transmit the data, and hence both data transmission and time adjustment are carried out via the signal feedback loop.

4. The feedback system of claim 3, wherein the signal feedback loop is a circuit that starts out from the data strobe pin of the control chipset, connects first with the data strobe pin of the memory module slot closest to the control chipset, the other memory module slots are similarly connected serially from near to far with the memory module slot furthest from the control chipset connected the last, and the data strobe pin of the last memory module slot is connected to the data strobe feedback pin of the control chipset.

* * * * *